(12) United States Patent
Ren

(10) Patent No.: US 6,853,319 B1
(45) Date of Patent: Feb. 8, 2005

(54) METHOD OF DETERMINING A MERGING BIT IN AN OPTICAL STORAGE DEVICE

(75) Inventor: Tsung-Huei Ren, Taipei (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 0 days.

(21) Appl. No.: 10/707,837

(22) Filed: Jan. 16, 2004

(30) Foreign Application Priority Data

Sep. 29, 2003 (TW) ........................... 92126903 A

(51) Int. Cl.⁷ .............................................. H03M 5/00
(52) U.S. Cl. ......................................... 341/58; 341/68
(58) Field of Search ........................... 341/50, 59, 58, 341/55, 68, 69

(56) References Cited

U.S. PATENT DOCUMENTS

| 5,210,711 | A | * | 5/1993 | Rossmere et al. | 708/709 |
| 6,268,810 | B1 | * | 7/2001 | Shim et al. | 341/59 |
| 6,781,527 | B2 | * | 8/2004 | Shim et al. | 341/58 |
| 2002/0126765 | A1 | * | 9/2002 | Son et al. | 375/295 |

* cited by examiner

*Primary Examiner*—Peguy JeanPierre
(74) *Attorney, Agent, or Firm*—Winston Hsu

(57) ABSTRACT

A method of determining a merging bit in an optical storage device. The method includes appending one bit to a fourteen-bit set of data output from an eight-to-fourteen modulator, dividing the fifteen-bit set of data into five local digital-sum-values of three bits, adding the five local digital-sum-values to an initial digital-sum-value to generate a sub-digital-sum-value, and generating the merging bit according to the sub-digital-sum-value.

5 Claims, 3 Drawing Sheets

| Local digital-sum-value | Initial NRZ level | Merging bit[0][1][2] |
|---|---|---|
| -3 | 0 | 0 0 0 |
| -1 | 1 | 0 1 0 |
| 1 | 1 | 0 0 1 |
| -3 | 1 | 1 0 0 |
| 3 | 1 | 0 0 0 |
| 1 | 0 | 0 1 0 |
| -1 | 0 | 0 0 1 |
| 3 | 0 | 1 0 0 |

Fig. 3

METHOD OF DETERMINING A MERGING BIT IN AN OPTICAL STORAGE DEVICE

BACKGROUND OF INVENTION

1. Field of the Invention

The present invention relates to a method of determining a merging bit, and more particularly, to a method of determining a merging bit which can make a digital-sum-value close to zero to comply with a run-length rule.

2. Description of the Prior Art

In the prior art rewritable optical recording system, 8-bit symbol data should be encoded in non-return-to-zero (NRZ) format and be transformed into 14-bit channel bit data, the two steps together being called eight-to-fourteen modulation. According to the Red Book, when the data "0" appears in a data stream of 14 bits, the run-length of "0" is limited to shorter than 11T (11 periods of a reference clock) and longer than 3T, this being called the run-length rule. The run-length is limited to maintain the linear speed of the compact disc according to the data stream of 14 bits. 3T represents a 720 KHz signal with the linear speed 1.2 m/s and 11T represents a 196 KHz signal with the linear speed 1.2 m/s, with any signal out of the standard timing being regarded as an error message.

In addition, the digital-sum-value is generated by the NRZ of the 14 bits. This helps the average potential of the NRZ of the 14 bits to be close to the DC potential. According to the Red Book, three merging bits must be inserted into any two data streams of 14 bits for complying with the run-length rule and for keeping the average potential of the NRZ of the 14 bits near the DC potential. The ideal merging bits should be carefully calculated.

The prior art requires four memories or registers to record the former 14 bits, the latter 14 bits, the digital-sum-value of the 14 bits and the NRZ level. A merging bit is determined by the data of the four memories according to a predetermined table. However, this requires more memory to store the predetermined table and a decoding circuit to calculate data, and thus, reduces the speed of the data process in the rewritable optical recording system.

SUMMARY OF INVENTION

It is therefore a primary objective of the claimed invention to provide a method of determining a merging bit to solve the above-mentioned problem.

The claimed invention provides a method of determining merging bit. The method includes appending 1 bit to a 14-bit data output from an eight-to-fourteen modulator, dividing the resulting 15-bit set of data into five local digital-sum-values of three bits, adding the five local digital-sum-values to an initial digital-sum-value to generate a sub-digital-sum-value, and generating the merging bit according to the sub-digital-sum-value and a predetermined value.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 3 is a merging bit table according to the present invention.

DETAILED DESCRIPTION

Figure 1:
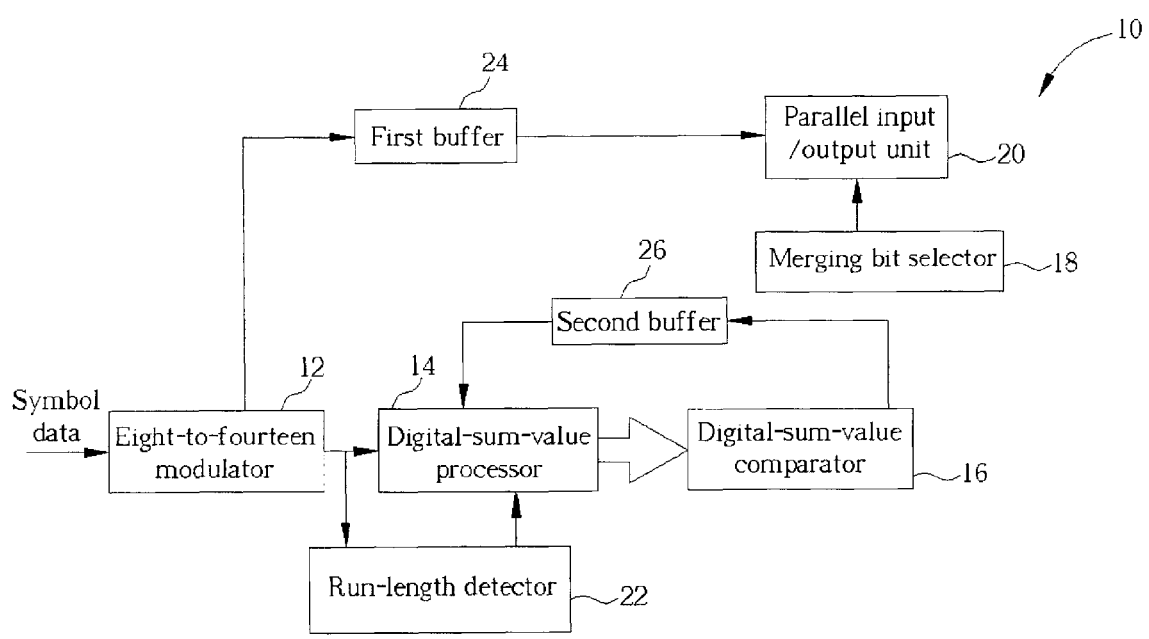
FIG. 1 is a block diagram of an optical recording system according to the present invention.

Please refer to FIG. 1. FIG. 1 is a block diagram of an optical recording system 10 according to the present invention. The optical recording system 10 comprises an eight-to-fourteen modulator 12, a digital-sum-value processor 14, a digital-sum-value comparator 16, a merging bit selector 18, a parallel input/output unit 20, a run-length detector 22, a first buffer 24, and a second buffer 26. The eight-to-fourteen modulator 12 is connected to the digital-sum-value processor 14, the first buffer 24, and the run-length detector 22, and is used for transforming an 8-bit data from an optical pick-up head into a 14-bit data and inputting the 14-bit data to other units for further processing. The run-length detector 22 inspects the run-length of the 14-bit data and outputs the run-length data to the digital-sum-value processor 14 for determining the merging bit. The digital-sum-value processor 14 is connected to the digital-sum-value comparator 16 for appending "0" to the 14-bit set of data to generate a 15-bit set of data, generating a sub-digital-sum-value, and generating four digital-sum-values to the digital-sum-value comparator 16 according to all probable merging bits for determining the final merging bit. The digital-sum-value comparator 16 is connected to the merging bit selector 18 for detecting the final merging bit and outputting a merging bit signal to the merging bit selector 18. The merging bit selector 18 is connected to the parallel input/output unit 20, and is used for outputting a signal to the parallel input/output unit 20 for inserting the final merging bit into the two 14-bit sets of data and outputting these in sequence.

Figure 2:
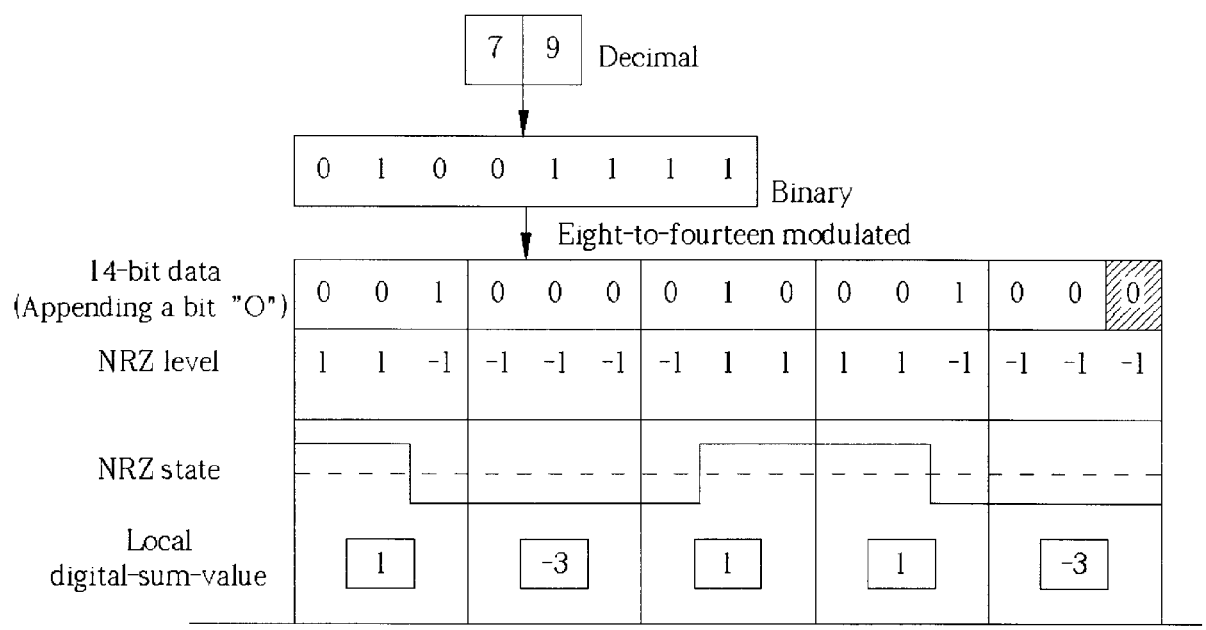
FIG. 2 is an example showing bit values according to the present invention.

Please refer to FIG. 2. FIG. 2 is an example of bit values according to the present invention. In the example, the input data is a decimal number "79". The decimal number "79" is transformed into an 8-bit symbol data "01001111" in binary. The 8-bit symbol data "01001111" is transformed into a 14-bit channel data "00100001000100" by the eight-to-fourteen modulator 12, the 14-bit channel data immediately being input into the digital-sum-value processor 14, the run-length detector 22, and the first buffer 24. The run-length detector 22 detects whether the 14 bits of the input data complies with the run-length rule and outputs the run-length data into the digital-sum-value processor 14 for determining the merging bit. The 14-bit data is stored in the first buffer 24, which waits for the final merging bit. After the 14-bit channel data is input into the digital-sum-value processor 14, the 14-bit data becomes a 15-bit data "001000010001000" by receiving an appended bit "0". The 15-bit set of data is divided into five sets of local bit data of three bits, the five sets being "001", "000", "010", "001", and "000". According to the run-length rule, if the initial NRZ level is "1", the NRZ levels of the five sets of local bit data of three bits respectively. According to the NRZ levels, the digital-sum-value of the first set is "1" (1+1−1=1), the corresponding local digital-sum-value being "1". In the same way, the local digital-sum-value of the second set is "−3" (−1−1−1=−3); the local digital-sum-value of the third set is "1" (−1+1+1=1); the local digital-sum-value of the fourth set is "1" (1+1−1=1); and the local digital-sum-value of the fifth set is"−3" (−1−1−1=−3). Finally, adding up the five local digital-sum-values, the sum of the five local digital-sum-values should be "−3" (1−3+1+1−3=31 3). A sub-digital-sum-value is generated by adding the initial digital-sum-value to the sum of the five local digital values. If the initial digital-sum-value is "1", the sub-digital-sum-value should be "−2"(1−3=31 2).

Please refer to FIG. 3. FIG. 3 is a merging bit table according to the present invention. The table shows all three-bit merging bits with different initial NRZ levels to generate the corresponding local digital-sum-value. The digital-sum-value processor 14 outputs a digital-sum-value to the digital-sum-value comparator 16 according to the run-length data from the run-length detector 22 and the merging bit table in FIG. 3. The digital-sum-value comparator 16 determines the final merging bit according to the rule that the digital-sum-value is close to zero and outputs a merging bit selecting signal to the merging bit selector 18. The final digital-sum-value and the NRZ level of the most significant bit of the 15-bit data are stored in the second buffer 26 for being the initial digital-sum-value and the initial NRZ level when determining the digital-sum-value of the next 15-bit data. The merging bit selector 18 inserts the final merging bit into the 14-bit stream according to the merging bit selecting signal from the digital-sum-value comparator 16.

Please refer to FIG. 3. In this case, the initial NRZ level is "1". When the merging bits are "010", the corresponding NRZ levels are "1,-1,-1" and the corresponding local digital-sum-value is "-1". In the same way, when the merging bits are "001", the corresponding NRZ levels are "1,1,-1" and the corresponding local digital-sum-value is "1". When the merging bits are "100", the corresponding NRZ levels are "-1,-1,-1" and the corresponding local digital-sum-value is "-3". When the merging bits are "000", the corresponding NRZ levels are "1,1,1" and the corresponding local digital-sum-value is "3". The digital-sum-value processor 14 generates four digital-sum-values by adding the sub-digital-sum-value to the four local digital-sum-values respectively and immediately inputs the four digital-sum-values into the digital-sum-value comparator 16. The digital-sum-value comparator 16 chooses the digital-sum-value which is close to zero; therefore, the acceptable merging bits are "001" whose local digital-sum-value is "1", and "000" whose local digital-sum-value is "3". If the run-length data from the run-length detector 22 indicates that when the merging bits are "001" or "000", the run-length complies with the run-length rule (i.e. shorter than 11T and longer than 3T), the digital-sum-value comparator 16 will determine the final merging bit according to a predetermined value. On the contrary, if the run-length data from the run-length detector 22 indicates that regardless of whether the merging bits are "001" or "000", the run-length does not comply with the run-length rule (i.e. not shorter than 11T and not longer than 3T), the digital-sum-value processor 14 will output a signal to the digital-sum-value comparator 16 to choose the final merging bits from the remaining merging bits which comply with the run-length rule and whose digital-sum-value is close to zero. In this case, all merging bits comply with the run-length rule, and the digital-sum-value comparator 16 will input the merging bits "000" or "001" into the merging bit selector 18. Finally, the merging bit selector 18 inserts "000" or "001" between the 14-bit data and the former 14-bit data and inputs the combination into the parallel input/output unit 20 for outputting.

Compared to the prior art, in the present invention, the 14-bit set of data becomes a 15-bit set of data by receiving an appended "0" bit. Further, by dividing the 15-bit set of data into five sets of three bits, the digital-sum-value processor only processes 3-bit data and the final merging bit is generated according to the related circuit of the present invention. This saves a large amount of circuit layout and improves the overall calculating speed.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of determining a merging bit, the method comprising:

(a) appending one bit to a fourteen-bit set of data output from an eight-to-fourteen modulator to make a fifteen-bit set of data;

(b) dividing the fifteen-bit set of data into five local digital-sum-values of three bits;

(c) adding the five local digital-sum-values to an initial digital-sum-value to generate a sub-digital-sum-value; and (d) generating the merging bit according to the sub-digital-sum-value and a predetermined value.

2. The method of claim 1 further comprising: generating the initial digital-sum-value by adding the local digital-sum-value corresponding to the former merging bit to the former sub-digital-sum-value.

3. The method of claim 1 wherein step (b) further comprises:

corresponding the three bits and an initial non-return-to-zero of the three bits to a first table for generating the local digital-sum-value.

4. The method of claim 1 wherein step (d) further comprises:

corresponding the sub-digital-sum-value and the predetermined value to a second table for generating the merging bit.

5. A device for carrying out the method of claim 1.

* * * * *